United States Patent
Krishnan et al.

(10) Patent No.: US 9,059,218 B2
(45) Date of Patent: Jun. 16, 2015

(54) REDUCING GATE EXPANSION AFTER SOURCE AND DRAIN IMPLANT IN GATE LAST PROCESS

(71) Applicant: GLOBALFOUNDRIES Inc., Grand Cayman (KY)

(72) Inventors: Bharat Krishnan, Mechanicville, NY (US); Jinping Liu, Ballston Lake, NY (US); Zhao Lun, Ballston Lake, NY (US); Hui Zhan, Clifton Park, NY (US); Bongki Lee, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/030,506

(22) Filed: Sep. 18, 2013

(65) Prior Publication Data

US 2015/0076622 A1    Mar. 19, 2015

(51) Int. Cl.
| | |
|---|---|
| *H01L 21/22* | (2006.01) |
| *H01L 29/66* | (2006.01) |
| *H01L 29/78* | (2006.01) |
| *H01L 21/225* | (2006.01) |

(52) U.S. Cl.
CPC ........ *H01L 29/6681* (2013.01); *H01L 29/7851* (2013.01); *H01L 21/2253* (2013.01)

(58) Field of Classification Search
CPC ............ H01L 21/2253; H01L 29/6681; H01L 29/7851
USPC .......................... 257/402; 438/283, 301, 514
See application file for complete search history.

(56) References Cited

U.S. PATENT DOCUMENTS

| | | | | |
|---|---|---|---|---|
| 4,486,943 | A * | 12/1984 | Ryden et al. | 438/303 |
| 5,747,378 | A * | 5/1998 | Fan et al. | 438/563 |
| 7,042,064 | B2 * | 5/2006 | Beasom | 257/528 |
| 7,074,662 | B2 * | 7/2006 | Lee et al. | 438/199 |
| 2004/0043586 | A1 * | 3/2004 | Ahmed et al. | 438/514 |
| 2006/0099745 | A1 * | 5/2006 | Hsu et al. | 438/149 |
| 2010/0328022 | A1 * | 12/2010 | Fan et al. | 338/309 |
| 2011/0097884 | A1 * | 4/2011 | Visokay et al. | 438/586 |
| 2011/0215421 | A1 * | 9/2011 | Lee et al. | 257/402 |

* cited by examiner

*Primary Examiner* — Christine Enad
(74) *Attorney, Agent, or Firm* — Wayne F. Reinke, Esq.; Heslin Rothenberg Farley & Mesiti P.C.

(57) ABSTRACT

A semiconductor structure includes a semiconductor substrate, an active region and a dummy gate structure disposed over the active region. A sacrificial conformal layer, including a bottom oxide layer and a top nitride layer are provided over the dummy gate structure and active region to protect the dummy gate during source and drain implantation. The active region is implanted using dopants such as, a n-type dopant or a p-type dopant to create a source region and a drain region in the active region, after which the sacrificial conformal layer is removed.

6 Claims, 1 Drawing Sheet

… (1/2)

REDUCING GATE EXPANSION AFTER SOURCE AND DRAIN IMPLANT IN GATE LAST PROCESS

BACKGROUND OF THE INVENTION

1. Technical Field

The present invention generally relates to semiconductor devices and methods of fabricating semiconductor devices, more particularly, to methods of reducing or eliminating gate expansion and maintaining gate critical dimension during source and drain implantation, in a replacement metal gate process.

2. Background Information

In semiconductor device fabrication, replacement gate or replacement metal gate techniques have been developed to address problems attendant upon substituting metal gate electrodes for dummy gate electrodes. In such a process, a sacrificial (or dummy) gate material such as, for instance, an amorphous silicon (a-Si) or polysilicon sacrificial gate material holds the gate position for subsequent metal gate electrodes to be formed. The sacrificial gates are subsequently replaced with, for instance, corresponding replacement metal gates or metal gate electrodes, after source and drain features of the device have been formed.

A goal of integrated circuit fabrication technology is to continue reducing the size of transistors, often employed in integrated circuits or semiconductor devices in order to reduce the size of the resultant devices and thereby provide higher performance, with lower power consumption. This goal includes continuing to provide enhancements to the above-noted gate fabrication approaches, including the replacement metal gate techniques for fabricating a gate structure.

SUMMARY OF THE INVENTION

The shortcomings of the prior art are overcome and additional advantages are provided through the provision, in one aspect, of a method of reducing or eliminating gate critical dimension expansion after implanting the source and drain regions, during replacement metal gate fabrication. The method includes providing a semiconductor structure, the structure including a semiconductor substrate, an active region for a source region, a drain region and a channel region therebetween, a dummy gate over the channel region, the dummy gate including at least one dummy gate material, the semiconductor structure further including at least one fin coupled to the substrate, and the active region being located across a top portion of each of the at least one fin. The method further includes creating a sacrificial conformal layer over the dummy gate, the source region and the drain region, the creating including conformally depositing an oxide layer over the dummy gate, the source region and the drain region, and conformally depositing a nitride layer over the oxide layer. The method further includes implanting one or more impurities through the sacrificial conformal layer to create the source region and the drain region, the one or more impurities entering the sacrificial layer from a first side and exiting an opposite side into the source region and drain region, and removing the sacrificial conformal layer after the implanting.

In accordance with another aspect, a semiconductor structure includes a semiconductor substrate, an active region, including a source region, a drain region and a channel region between the source region and the drain region, a dummy gate situated over the channel region, the dummy gate including at least one dummy gate material, a sacrificial conformal layer over the dummy gate, source region and drain region, and one or more performance-enhancing impurities in the active region.

These, and other objects, features and advantages of this invention will become apparent from the following detailed description of the various aspects of the invention taken in conjunction with the accompanying drawings.

DETAILED DESCRIPTION OF THE INVENTION

Figure 1:
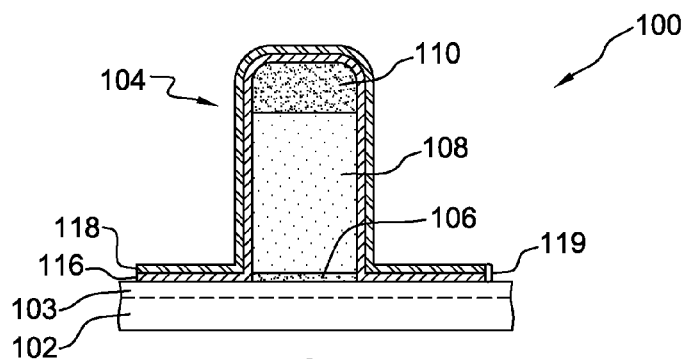
FIG. 1 is a cross-sectional elevational view of one example of an intermediate semiconductor structure, including a dummy gate disposed over a semiconductor substrate and a sacrificial conformal layer over the dummy gate and regions where the source and drain will be, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

FIG. 1 is a cross-sectional elevational view of one example of a semiconductor structure, generally denoted by 100, obtained at an intermediate stage of semiconductor fabrication. At the stage of fabrication depicted in FIG. 1, the semiconductor structure 100 includes a semiconductor substrate 102, for example, a bulk semiconductor material, e.g., a bulk silicon wafer. In one example, semiconductor substrate 102 may include any silicon-containing substrate including, but not limited to, silicon (Si), single crystal silicon, polycrystalline Si, amorphous Si, silicon-on-nothing (SON), silicon-on-insulator (SOI), or silicon-on-replacement insulator (SRI) substrates and the like. Semiconductor substrate 102 may in addition or instead include various isolations, dopings and/or device features. The semiconductor substrate may include other suitable elementary semiconductors, such as, for example, germanium (Ge) in crystal, a compound semiconductor such as silicon carbide (SiC), gallium arsenide (GaAs), gallium antimonide (GaP), indium phosphide (InP), indium arsenide (InAs), and/or indium antimonide (InSb) or combinations thereof an alloy semiconductor including GaAsP, AlInAs, GaInAs, GaInP, or GaInAsP or combinations thereof. Semiconductor substrate 102 may be a planar substrate or three-dimensional, such as, FinFETs.

Note that the intermediate structure 100 depicted in FIG. 1, may be obtained using a conventional replacement metal gate process. Accordingly, semiconductor substrate 102 includes an active region 103 for subsequent source, drain and channel regions to be at least partially formed therein. One or more gate structures 104 (also referred to as dummy gate) may be disposed over, for instance, active region 103, of semiconductor substrate 102. Each of these gate structures may include one or more conformally deposited layers, such as thin oxide layer 106 and a dummy gate material 108 such as, for example, amorphous silicon or polycrystalline silicon, disposed over thin oxide layer 106, to hold the gate position for subsequent replacement metal gate material. The various layers of gate structures 104 may be formed from a variety of different materials using a variety of techniques, such as, for example, atomic layer deposition (ALD) and chemical vapor deposition (CVD). The thickness of the layers may also vary, depending upon the particular application.

Continuing with FIG. 1, a layer of nitride 110 may be formed over dummy gate material 108. In one example, nitride layer 110, which acts as a hard mask layer to protect dummy gate material 108, may include a material such as, for example, silicon nitride and may be deposited using conventional deposition processes, such as, for example, chemical vapor deposition (CVD), low pressure CVD or plasma-enhanced CVD (PECVD). In a specific example, silicon nitride may be deposited using process gases such as, for example, dichlorosilane ($SiH_2Cl_2$) and ammonia ($NH_3$) under known process conditions. In another example, silicon nitride may also or alternatively be deposited using a halogen-free precursor such as, for example, bis(t-butylamino)silane (BT-BAS) ($SiC_8N_2H_{22}$) and ammonia ($NH_3$) at about 550° C.

A sacrificial oxide layer 116 is provided along the sidewalls of dummy gate structure 104 and extended over active region 103 where the source and drain regions will subsequently be, as further depicted in FIG. 1. In one example, oxide layer 116, which acts to protect dummy gate structure 104 during subsequent source and drain implantation, is conformally deposited over dummy gate structure 104 and extended over active region 103 where the source and drain regions will subsequently be, and may include a material such as, for example, silicon dioxide. Sacrificial oxide layer 116 may be deposited using conventional deposition processes, such as, for example, chemical vapor deposition (CVD), low pressure CVD or plasma-enhanced CVD (PECVD). The thickness of sacrificial oxide layer 116, disposed over dummy gate 104 and active region 103, may be in the range of about 10 Angstroms to about 15 Angstroms.

A sacrificial nitride layer 118 is disposed over sacrificial oxide layer 116, protecting dummy gate 104 and active region 103. Together, sacrificial oxide layer 116 and sacrificial nitride layer 118 are one example of sacrificial conformal layer 119. Sacrificial nitride layer 118 may be deposited using conventional deposition processes, such as, for example, chemical vapor deposition (CVD), low-pressure CVD, or plasma-enhanced CVD (PE-CVD). In one example, sacrificial nitride layer 118, having a thickness in the range of about 10 Angstroms to about 15 Angstroms, may include or be fabricated of a material, for instance, a nitride (such as, for example, SiN or $Si_3N_4$). This sacrificial nitride layer 118 advantageously facilitates in preventing oxidation of underlying oxide layer 116 and dummy gate structure 104, independent of the implantation technique employed to create the source region and the drain region.

Figure 2:
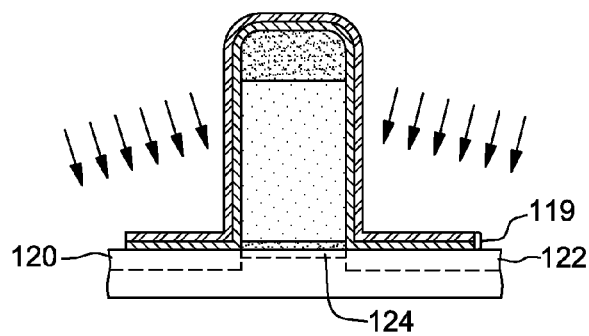
FIG. 2 depicts one example of the intermediate structure of FIG. 1 after implantation of the source and drain through the sacrificial conformal layer, in accordance with one or more aspects of the present invention.

As depicted in FIG. 2, active region 103 may have impurities added to create the source and drain by, for example, implanting with a dopant to create a source region 120 and a drain region 122 of the semiconductor device. The dopant employed may be a p-type dopant or a n-type dopant. As used herein, p-type dopant refers to the addition of an impurity to active region 103, for instance, an intrinsic semiconductor material of the active region, to create deficiencies of valence electrons. Examples of p-type dopant may include boron, aluminum, gallium, or indium, being added to the active region. The n-type dopant refers to the addition of impurities to, for instance, an intrinsic semiconductor material of active region 103, which contribute more electrons to an intrinsic material, and may include (for instance) phosphorus, antimony or arsenic. Note that dummy gate structure 104, which is being protected by sacrificial conformal layer 119, remains unaffected during the implantation process, advantageously facilitating in reducing or eliminating expansion of dummy gate structure 104, caused by conventional oxidation process, and thereby improving the gate critical dimension. Note also that a channel region 124 is created below dummy gate structure 104 and between source region 120 and drain region 122. Although not depicted in the figures, one skilled in art will understand that the ion implantation is followed by one or more anneals such as, for example, low temperature rapid thermal anneal (RTA) to complete the source and the drain fabrication process.

Figure 3:
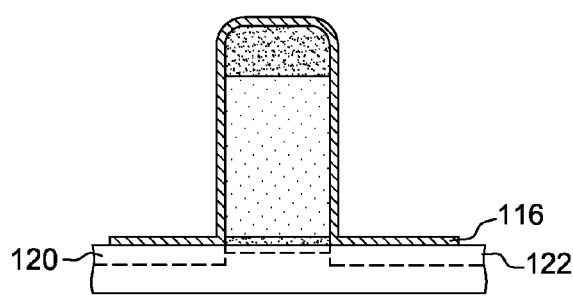
FIG. 3 depicts one example of the intermediate structure of FIG. 2 after the source and drain implant and partial removal of the sacrificial conformal layer, in accordance with one or more aspects of the present invention.

As illustrated in FIG. 3, one or more selective etching processes may be performed to selectively remove sacrificial nitride layer 118 (see FIG. 2) of sacrificial conformal layer 119, subsequent to the implantation process performed to create source region 120 and drain region 122. This selective removal process of sacrificial nitride layer 118 (see FIG. 2) is selective to underlying sacrificial oxide layer 116 and may be performed using one or more isotropic wet etching process. In a specific example, the sacrificial nitride layer may be selectively removed using conventional wet chemistries, such as a hot phosphoric acid etch process. This selective removal process advantageously facilitates in preventing oxidation of underlying sacrificial oxide layer 116 and dummy gate structure 104, reducing or eliminating expansion of underlying dummy gate structure 104 during subsequent fabrication.

Figure 4:
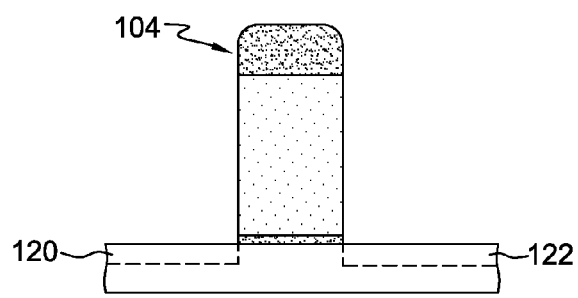
FIG. 4 depicts one example of the intermediate structure of FIG. 3 after complete removal of the sacrificial conformal layer, in accordance with one or more aspects of the present invention.

One or more etching processes may be performed to remove sacrificial oxide layer 116, as depicted in FIG. 4. These one or more etching processes may be one or more conventional dry-etch processes such as, for example, remote plasma-based oxide removal processes. In another example, one or more conventional wet etching processes, involving wet hydrofluoric acid, may instead be performed to remove sacrificial oxide layer 116, exposing the underlying dummy gate structure 104. In still another example, a combination of both conventional dry-etch processes such as, for example, remote plasma-based oxide removal processes and conventional wet etching processes, such as, for example, wet hydrofluoric acid processes, may be employed to remove the sacrificial oxide layer. Note that the deposition of sacrificial conformal layer 119 (see FIG. 2) and subsequent removal thereof advantageously facilitate in maintaining the critical dimension of the resultant gate structure.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising:
   providing a semiconductor structure, the structure comprising: a semiconductor substrate; an active region for a source region, a drain region and a channel region therebetween; and a dummy gate over the channel region, the dummy gate comprising at least one dummy gate material, wherein the semiconductor structure further comprises at least one fin coupled to the substrate, and wherein the active region is located across a top portion of each of the at least one fin; creating a sacrificial conformal layer over the dummy gate, the source region and the drain region, the creating comprising: conformally depositing an oxide layer over the dummy gate, the source region and the drain region; and conformally depositing a nitride layer over the oxide layer; implanting one or more impurities through the sacrificial conformal layer to create the source region and the drain region, wherein the one or more impurities enter the sacrificial layer from a first side and exit an opposite side into the source region and drain region; and removing the sacrificial conformal layer after the implanting.

2. The method of claim 1, wherein the dummy gate comprises a layer of polycrystalline silicon and a layer of a nitride over the layer of polycrystalline silicon.

3. The method of claim 1, wherein the oxide layer and the nitride layer each have a thickness of about 10 Angstroms to about 15 Angstroms.

4. The method of claim 1, wherein removing the sacrificial conformal layer comprises: removing the nitride layer and stopping at the oxide layer; and removing the oxide layer.

5. The method of claim 4, wherein removing the nitride layer comprises using heated phosphoric acid.

6. The method of claim 4, wherein removing the oxide layer comprises using at least one of a remote plasma-based oxide removal technique and a wet hydrofluoric acid removal technique.

* * * * *